United States Patent
Auth et al.

(10) Patent No.: US 9,023,666 B2
(45) Date of Patent: May 5, 2015

(54) METHOD FOR ELECTRON BEAM INDUCED ETCHING

(75) Inventors: Nicole Auth, Gustavsburg (DE); Petra Spies, Mainz (DE); Rainer Becker, Pfungstadt (DE); Thorsten Hofmann, Rodgau (DE); Klaus Edinger, Lorsch (DE)

(73) Assignee: Carl Zeiss SMS GmbH, Jena (DE)

( * ) Notice: Subject to any disclaimer, the term of this patent is extended or adjusted under 35 U.S.C. 154(b) by 0 days.

(21) Appl. No.: 13/058,587

(22) PCT Filed: Aug. 13, 2009

(86) PCT No.: PCT/EP2009/005885
§ 371 (c)(1),
(2), (4) Date: Apr. 13, 2011

(87) PCT Pub. No.: WO2010/017987
PCT Pub. Date: Feb. 18, 2010

(65) Prior Publication Data
US 2011/0183444 A1  Jul. 28, 2011

(30) Foreign Application Priority Data
Aug. 14, 2008 (DE) ................ 10 2008 037 943

(51) Int. Cl.
*H01L 21/00* (2006.01)
*H01L 21/3065* (2006.01)
*H01L 21/311* (2006.01)
*H01L 21/3213* (2006.01)

(52) U.S. Cl.
CPC ...... *H01L 21/3065* (2013.01); *H01L 21/31116* (2013.01); *H01L 21/32136* (2013.01)

(58) Field of Classification Search
CPC ............ H01L 21/3065; H01L 21/30655; H01L 21/32136; H01L 21/31116
USPC ............ 438/3, 6, 8, 689, 700, 707, 712; 257/E21.219, E21.238, E21.249; 156/345.24, 345.33
See application file for complete search history.

(56) References Cited

U.S. PATENT DOCUMENTS 4,226,666 A   10/1980 Winters et al.
4,639,301 A   1/1987 Doherty et al.
(Continued)

FOREIGN PATENT DOCUMENTS

DE  102 61 035 A1  10/2003
DE  103 38 019 A1  3/2005
(Continued)

OTHER PUBLICATIONS

H.F. Winters et al., "The etching of silicon with $XeF_2$ vapour", Appl. Phys. Left. 34(1), 70 (1979).
(Continued)

*Primary Examiner* — Khiem D Nguyen
(74) *Attorney, Agent, or Firm* — Fish & Richardson P.C.

(57) ABSTRACT

The invention relates to a method for electron beam induced etching of a material (100, 200) with the method steps providing at least one etching gas at a position of the material (100, 200) at which an electron beam impacts on the material (100, 200) and simultaneously providing at least one passivation gas which is adapted for slowing down or inhibiting a spontaneous etching by the at least one etching gas.

26 Claims, 3 Drawing Sheets

(56) References Cited

U.S. PATENT DOCUMENTS

| | | | |
|---|---|---|---|
| 4,851,097 A | 7/1989 | Hattori et al. | |
| 4,874,459 A | 10/1989 | Coldren et al. | |
| 5,055,696 A | 10/1991 | Haraichi et al. | |
| 5,188,705 A | 2/1993 | Swanson et al. | |
| 5,273,935 A * | 12/1993 | Morimoto et al. | 204/192.33 |
| 5,501,893 A | 3/1996 | Laermer et al. | |
| 5,683,547 A | 11/1997 | Azsuma et al. | |
| 6,042,738 A | 3/2000 | Casey, Jr. et al. | |
| 6,531,403 B2 * | 3/2003 | Ezaki | 438/710 |
| 6,639,226 B2 | 10/2003 | Morio et al. | |
| 6,753,538 B2 | 6/2004 | Da et al. | |
| 6,787,783 B2 | 9/2004 | Marchman et al. | |
| 6,843,927 B2 | 1/2005 | Naser-Ghodsi | 216/84 |
| 6,897,157 B2 | 5/2005 | Liang et al. | |
| 6,991,878 B2 | 1/2006 | Kanamitsu et al. | |
| 7,095,021 B2 | 8/2006 | Shichi et al. | |
| 7,172,839 B2 | 2/2007 | Sugiyama et al. | |
| 7,368,729 B2 | 5/2008 | Shichi et al. | |
| 7,391,039 B2 | 6/2008 | Kitamura et al. | |
| 7,662,524 B2 | 2/2010 | Stewart et al. | |
| 7,670,956 B2 | 3/2010 | Bret et al. | |
| 7,692,163 B2 | 4/2010 | Nagano | |
| 7,727,681 B2 | 6/2010 | Stewart et al. | |
| 8,076,650 B2 | 12/2011 | Smith et al. | |
| 8,110,814 B2 | 2/2012 | Ward et al. | |
| 2002/0033229 A1 * | 3/2002 | Lebouitz et al. | 156/345 |
| 2003/0020176 A1 * | 1/2003 | Nambu | 257/774 |
| 2003/0047691 A1 | 3/2003 | Musil et al. | |
| 2003/0146485 A1 * | 8/2003 | Ezaki | 257/499 |
| 2003/0215722 A1 | 11/2003 | Kanamitsu et al. | |
| 2003/0224601 A1 | 12/2003 | Roy et al. | |
| 2004/0032029 A1 | 2/2004 | Tanikuni | 257/762 |
| 2004/0048398 A1 | 3/2004 | Liang et al. | |
| 2004/0113097 A1 | 6/2004 | Marchman et al. | |
| 2004/0131953 A1 | 7/2004 | Sugiyama et al. | |
| 2004/0151991 A1 | 8/2004 | Stewart et al. | |
| 2004/0226814 A1 | 11/2004 | Stewart et al. | |
| 2005/0014383 A1 | 1/2005 | Ji et al. | |
| 2005/0108892 A1 | 5/2005 | Wu et al. | |
| 2006/0030064 A1 | 2/2006 | Roy et al. | |
| 2006/0037182 A1 | 2/2006 | Roy et al. | |
| 2006/0115966 A1 | 6/2006 | Roy et al. | |
| 2006/0134920 A1 | 6/2006 | Liang | |
| 2006/0147814 A1 | 7/2006 | Liang | |
| 2006/0228634 A1 | 10/2006 | Bret et al. | |
| 2006/0255270 A1 | 11/2006 | Kitamura et al. | |
| 2007/0010097 A1 | 1/2007 | Deering et al. | |
| 2007/0087572 A1 | 4/2007 | Le Roy et al. | |
| 2007/0158304 A1 * | 7/2007 | Nasser-Ghodsi et al. | 216/66 |
| 2007/0187622 A1 | 8/2007 | Nagano | |
| 2007/0267579 A1 | 11/2007 | Sugiyama et al. | |
| 2009/0111036 A1 | 4/2009 | Stewart et al. | |
| 2009/0309018 A1 | 12/2009 | Smith et al. | |
| 2010/0186768 A1 | 7/2010 | Kanamitsu | |
| 2010/0203431 A1 | 8/2010 | Bret et al. | |
| 2010/0282596 A1 | 11/2010 | Auth et al. | |
| 2011/0183523 A1 | 7/2011 | Auth et al. | |
| 2012/0080407 A1 | 4/2012 | Smith et al. | |

FOREIGN PATENT DOCUMENTS

| | | | |
|---|---|---|---|
| DE | 11 2006 000 129 T5 | 11/2007 | |
| EP | 1 664 924 | 6/2006 | |
| JP | 02256235 | 10/1990 | H01L 21/302 |
| JP | 04186831 | 7/1992 | H01L 21/285 |
| JP | 08-250478 A | 9/1996 | |
| JP | 2004079761 | 3/2004 | H01L 21/318 |
| JP | 2005-159287 A | 6/2005 | |
| JP | 2005537683 | 12/2005 | G01R 31/26 |
| JP | 2006-515937 A | 6/2006 | |
| JP | 2006-319105 A | 11/2006 | |
| KR | 2007-0033307 | 3/2007 | |
| TW | 556327 | 10/2003 | |
| TW | I257673 | 7/2006 | |
| WO | WO 03/003118 | 1/2003 | |
| WO | WO 2004/066027 A2 | 8/2004 | |
| WO | WO 2005/017949 | 2/2005 | |
| WO | WO 2005/017949 A2 | 2/2005 | |
| WO | WO 2006/074198 A2 | 7/2006 | |
| WO | WO 2007/025039 | 3/2007 | |
| WO | WO 2007/100933 | 9/2007 | |
| WO | WO 2009/080707 | 7/2009 | |
| WO | WO 2010/017963 | 2/2010 | |

OTHER PUBLICATIONS

J.W. Coburn et al., "Ion and electron-assisted gas-surface chemistry—An important effect in plasma etching", J. Appl. Phys. 50(5), 3189 (1979).

K. Tsujimoto et al., "A New Side Wall Protection Technique in Microwave Plasma Etching Using a Chopping Method", Conf. on Solid State Devices and Materials, 229-233, Tokyo 1986.

Leonhardt et al., "Etching with electron bean generated plasmas," J. Vac. Sci. Technol. A 22(6), Nov./Dec. 2004.

Randolph et al., "Focused, nanoscale-electron-beam-induced deposition and etching," Critical Reviews in Solid State and Materials Sciences, CRC Press, Boca Raton, FL, vol. 31, No. 3, Sep. 1, 2006, pp. 55-89.

Lassiter et al., "Inhibiting spontaneous etching of nanoscale electron beam induced etching features: Solutions for nanoscale repair of extreme ultraviolet lithography masks," J. Vac. Sci. Technol., vol. 26, No. 3, May 2008, pp. 963-967.

Matsui et al., "Direct writing onto Si by electron beam stimulated etching," Appl. Phys. Left. 51(19), 1498 (1987).

International Search Report for corresponding PCT Appl. No. PCT/EP2009/005885, mailed Nov. 6, 2009.

The English translation of International Preliminary Report on Patentability for corresponding PCT Appl. No. PCT/EP2009/005885, dated May 2, 2011.

German Office Action., with English translation, for corresponding DE Application No. 10 2008 037 943.3, dated May 4, 2009.

Watanabe et al., "Low-Damage Electron-Beam-Assisted Dry Etching of Gaas and Aigaas Using Electron Using Electron Cyclotron Resonance Plasma Electron Source," J. Vac. Sci. Technol. B (11)6, Nov./Dec. 1993, pp. 2288-2293.

Yoshida et al., "The effect of EB irradiation with and without hot-jet C12 on an ultra-thin GaN layer for selective etching," Applied Surface Science, 100/101 (1996) 184-188.

The European Search Report for corresponding EP Appl No. 12 17 1753, dated Aug. 22, 2012.

Written Opinion of the International Search Authority, with English translation, for corresponding PCT Appl No. PCT/EP2009/005885, dated Feb. 14, 2011.

Japanese Office Action, Japanese Application No. 2011-522438, with an English Summary, 6 pages, dated Jun. 10, 2013.

Taiwanese Search Report, with translation thereof, for TW Appl No. 098127221, dated Jun. 13, 2014.

Korean Office Action, with English translation, for corresponding KR Appl No. 10-2011-7005668, dated Jan. 30, 2015.

* cited by examiner

METHOD FOR ELECTRON BEAM INDUCED ETCHING

1. TECHNICAL FIELD

The present invention relates to a method for electron beam induced etching.

2. PRIOR ART

Etching processes play an important roll in industry, in particular in semiconductor industry. Using etching processes, fine structures are prepared down to the nanometer range. Further, etching processes have an important function at the repair photolithography masks.

For the manufacturing of fine structures by means of etching processes, as they are used in semiconductor technology, etching under the impact of a focused ion beam is known by the acronym FIB (focused ion beam) in the prior art. For example, the FIB technology is disclosed in the U.S. Pat. No. 4,639,301. The particular advantage of the FIB technology is to allow the manufacturing of very flat and very steep side walls, i.e. structures with a large aspect ratio. The aspect ratio characterizes the ratio of the depth or height, respectively, of a structure to their smallest lateral extension.

The flat side walls manufactured with the FIB technology are based on the fact that the material removal at this technology is to some extent not done by etching, but by sputtering with a focused ion beam. However, the FIB technology has serious disadvantages. The sputtering action of the ion beam causes also material removal outside of the region to be etched. This effect is described in the U.S. Pat. No. 6,753,538 as "river bedding" effect. On the other hand, as is also disclosed in the U.S. Pat. No. 6,753,538, ions are implanted in the layer below the layer to be etched ("staining"). This changes the properties or damages this layer, respectively. In addition, a good portion of the sputtered material is deposited on other positions of the sample or in the vacuum chamber ("re-deposition").

When using an electron beam instead of an ion beam for inducing the etching process (electron beam induced etching, EBIE), the material removal exclusively occurs by etching, as it is disclosed in the U.S. Pat. No. 6,753,538. The sputtering portion occurring in the FIB technique disappears in the EBIE. The article "Direct writing onto Si by electron beam stimulated etching" of S. Matsui and K. Mori (Appl. Phys. Lett. 51(19), 1498 (1987)) presents investigations for the etching of silicon using the etching gas xenon difluoride ($XeF_2$), and, if applicable, with an additional electron beam. Due to the application of an electron beam the etching rate in silicon doubles compared to exclusively applying the etching gas $XeF_2$. The processes occurring on an atomic or molecular scale, respectively, at the etching of silicon with $XeF_2$ and of different materials with different etching gases under the impact of corpuscular radiation have been investigated by J. W. Coburn and H. F. Winters (J. W. Coburn and H. F. Winters, "The etching of silicon with $XeF_2$ vapour", Appl. Phys. Lett. 34(1), 70 (1979) and J. W. Coburn and H. F. Winters, "Ion and electron-assisted gas-surface chemistry—An important effect in plasma etching", J. Appl. Phys. 50(5), 3189 (1979)).

The authors of the article "A New Side Wall Protection Technique in Microwave Plasma Etching Using a Chopping Method" of K. Tsujimoto et al., investigate a plasma etching process at which the etching process is repeatedly interrupted after a certain period and successive deposition of a nitride film to protect the emerging side walls (K. Tsujimoto, S. Tachi, K. Ninomiya, K. Suzuki, S. Okudaira and S. Nishimatsu, "A New Side Wall Protection Technique in Microwave Plasma Etching Using a Chopping Method", Conf. on Solid State Devices and Materials, 229-233, Tokyo 1986).

The U.S. Pat. No. 5,501,893 discloses a method for the solution of the problem of lateral etching when using electron beam induced etching. At this process, similar to the above-referenced article of K. Tsujimoto et al., the etching process is interrupted after a removal of approximately 2 μm and the side walls are protected by the deposition of materials forming polymers. Thereafter, this process is continued by alternating etching and passivation until the desired etching depth is reached.

The essential drawback of this step by step etching and passivation process is the formation of ripples at the side walls. During the first etching step lateral etching of the side walls occur, since the emerging side walls are not yet protected. By the successive application of the passivation step a rippled passivation layer is formed whose thickness depends from their height. This impairs the steepness and flatness of the etched side walls. In particular, at small dimensions of the structures to be etched, this can lead problems in the subsequent process steps.

The expression "spontaneous etching" has the meaning in this application that etching of a material occurs under the impact of at least one etching gas without the impact of an electron beam on the material.

The present invention is therefore based on the problem to indicate a method for electron beam induced etching which at least partly avoids the above-mentioned drawbacks.

3. SUMMARY OF THE INVENTION

According to an embodiment of the present invention, this problem is solved by a method for electron beam induced etching of a material which comprises providing at least one etching gas at the position of the material at which an electron beam impacts on the material and simultaneously providing at least one passivation gas adapted for slowing down or inhibiting spontaneous etching by the at least one etching gas.

Surprisingly, it has been found out that the supply of a passivation gas to the etching gas at the electron beam induced etching effectively suppresses spontaneous etching. For this reason, the interruption of the etching process taught by the U.S. Pat. No. 5,501,893 for the successive formation of a passivation film at the side walls can be set aside, whereby the inventive method can be performed more simply, and therefore with lower cost. However, the particular advantage of the inventive method is that the spontaneous etching of the side walls is efficiently suppressed without the deposition of a passivation layer on the side walls. Thus, the inventive method results in very flat side walls.

In particular by the simultaneous provision of a passivation gas, spontaneous etching of different materials to be etched can be suppressed by a respective adjustment of the partial pressure ratio of the etching gas and the passivation gas.

In a preferred embodiment of the inventive method xenon difluoride ($XeF_2$) is used as etching gas. However, it is also conceivable to use other etching gases, as for examples elements of the group of halogens, as for example chlorine ($Cl_2$), bromine ($Br_2$) or iodine ($I_2$) or further halogenated compounds.

In a particularly preferred embodiment ammonia ($NH_3$) is used a passivation gas. However, the inventive method is not restricted to the application of $NH_3$ as passivation gas. It is conceivable to use different passivation materials, as for example nitrogen ($N_2$), oxygen ($O_2$), carbon dioxide ($CO_2$), carbon tetrachloride ($CCl_4$) and/or methane ($CH_4$).

At the etching of silicon particularly good results are obtained at a gas flow rate of 0.25 sccm (standard cubic centimeter per minute).

In a particularly preferred embodiment of the inventive method the material to be etched comprises multiple layers and has the following process steps:

Determining whether a layer boundary between at least one first and at least one second layer is reached; and adapting the provision of the passivation gas for slowing down or inhibiting lateral etching of at least the second layer.

This embodiment enables, when etching through multiple layers lying upon another and having different materials, to adjust the gas flow rate of the passivation gas, so that during the electron beam induced etching of each individual layer lateral etching of the respective layer is slowed down or inhibited. Thus, the inventive method allows the preparation of fine structures with large aspect ratios across multiple layers with different materials without interrupting the EBIE process. Thus, the so-called "circuit editing" for a semiconductor element becomes possible, i.e. the directed subsequent modification of microscopic small electrical structures by precisely cutting or connecting the conductive paths of the device with one another.

In a preferred embodiment, it is determined by evaluation of an analysis signal whether a layer boundary is reached. In an embodiment, the analysis signal comprises detecting of secondary electrons originating from the surface which is currently etched. For the winning of an analysis signal the well-known methods of surface analysis can be used, for example the Auger electron spectroscopy (AES), the photoelectron spectroscopy (XPS), or the mass spectroscopy. In this context, the application of imaging analysis methods is also conceivable, as for example electron beam microscopy, scanning tunneling microscopy, or atomic force microscopy, or combinations of these techniques.

In a further preferred embodiment, it is determined by measuring of the etching time whether a layer boundary is reached. In a separate measurement the etching rate for different materials depending of the etching gas and the passivation gas can be determined for a layered system having a known thickness and a known composition of the individual layers. This information can then be used to determine from the etching time when a layer boundary will be reached. Admittedly, the two alternatives, evaluation of an analysis signal and measurement of the etching time, can also be combined.

Further embodiments of the inventive method are defined in further dependent patent claims.

4. DESCRIPTION OF THE DRAWINGS

In the following detailed description presently preferred embodiments of the invention are described with reference to the drawings, wherein FIG. 1 shows a schematic representation for the realization of the method according to a first aspect of the invention, wherein a material in a vacuum chamber is etched by the combined impact of an etching gas, a passivation gas and a focused electron beam;

5. DETAILED DESCRIPTION OF PREFERRED EMBODIMENTS

In the following preferred embodiments of the inventive method and of the inventive apparatus are explained in detail.

Figure 1:
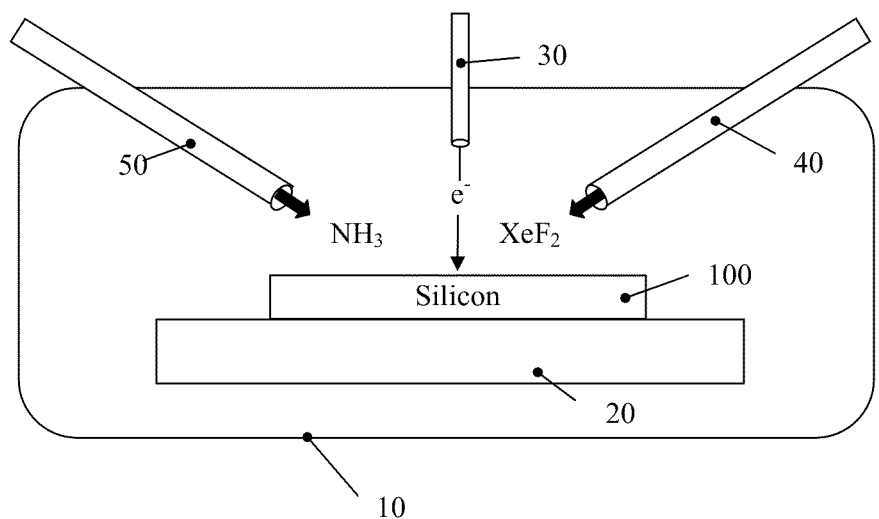

As is schematically represented in FIG. 1, the silicon layer to be etched 100 is arranged on a specimen holder 20 in a vacuum chamber 10. The vacuum chamber 10 is for example the vacuum chamber of an electron beam apparatus 30, which is for example an electron microscope adapted for the inventive method.

In the preferred embodiment of the present invention represented schematically in FIG. 1, $XeF_2$ is introduced via the inlet 40 or the inlet nozzle 40 in the vacuum chamber 10. In parallel to $XeF_2$ also other halogens are possible, for example $Cl_2$, $Br_2$ and $I_2$ or halogenated compounds, as for example $SF_6$. The inventive method is not restricted to the application of halogenated compounds. Conceivable further etching gases are nitrogen monoxide (NO), nitrogen dioxide ($NO_2$) or other strongly oxidizing substances. The inventive method also allows the simultaneous application of more than one etching gas. Additionally, the mixing ratio of the etching gases can be changed during the etching process.

In the embodiment represented in FIG. 1, the passivation gas $NH_3$ is introduced in the vacuum chamber 10 via the inlet 50. In parallel to $NH_3$ also $N_2$, $O_2$, $CO_2$, $CCl_4$ and/or $CH_4$ can be applied as passivation gases. All materials are conceivable as passivation gases which can occupy possible absorption positions at the surface of the material to be etched (i.e. at the side walls and at the bottom area) and can therefore supersede the etching gas from the absorption positions. The passivation gas can be formed from two or several gases or materials, respectively, and their mixing ratio can change during the etching process.

$XeF_2$ as well as $NH_3$ are brought up to the area of the silicon layer 100 to be etched via suitable dosing valves (not shown in FIG. 1) through the corresponding inlets 40, 50. It is possible to introduce the two gases $XeF_2$ and $NH_3$ via separate dosing valves but with a common inlet (not represented in FIG. 1). Alternatively to the gas inlet directed to the surface to be etched, the etching gas and/or the passivation gas can also be introduced undirected in the vacuum chamber 10.

The dosage of $XeF_2$ and $NH_3$ can be independent of time. It is also possible to temporally modify the dosages of both gases and/or of one of the gases during the etching process ("chopping").

The precise dosage ratios of the etching gas and the passivation gas depend significantly from the geometry of the vacuum chamber, the pump power of the applied vacuum pumps as well as of the geometric arrangement of the one or the multiple gas inlets 40 or 50, respectively. Generally, the partial pressure of two gases or their gas flow rates are adjusted so that the partial pressure of the passivation gas is lower than the partial pressure of the etching gas.

In parallel to the mixing ratio of the etching gas and the passivation gas, the electron beam has a main roll in the EBIE process. For the inventive method preferably electron energies are used between 0.1 keV and 30 keV in dependence of the material to be etched. In the process, the energy of the electron beam is a conceivable parameter for the optimisation of the inventive method. A further parameter characterizing the etching process is the value of the electron current which determines how many electrons per time unit are impacting on the material surface. For the etching profile indicated in FIG. 2, the strength of the electron current is in the range of 50 pA and 200 pA.

To optimally support the processes occurring at the surface, the electron beam is carried in repeated steps over the material to be etched. The time period until the electron beam comes back to the previously processed position ("refresh time") is preferably adjusted so that this position of the etching surface is again sufficiently supplied from the inlets 40 and 50 with new molecules necessary for the reaction. The dwell time describes the time period the electron beam remains on each individual position. In a typical process, the dwell time is several 10 ns, for example 50 ns, and the refresh time is in the range of some milliseconds, for example 2 ms (millisecond). Additionally, it may be useful, depending from the size of the area to be processed, to vary the strength of the current of the electron beam and the distance of successive pixels. At small areas to be etched, the strengths of the electron current are for example in the range of 50 pA and the electron beam has an exemplarily pixel distance of 2 nm. On the other hand, large areas are for example processed with an electron beam in the range of 200 pA and a pixel distance of approximately 4 nm.

For the initialization of the etching reaction preferably exclusively a focussed electron beam is used. However, additionally or alternatively other energy transferring mechanisms can be applied (for example a focused laser beam and/or an unfocused ion beam).

The value of the spontaneous etching rate of an etching gas depends essentially from the material to be etched. This means that when etching for example a deep trench the effect of spontaneous etching to the structure to be etched can depend on the material to be etched.

The inventive method does not restrict the material to be etched. For example, materials of the classes of metals, semiconductors and/or isolators can be etched. Similarly, materials which are made up of combinations of the different classes can also be removed with the inventive etching method. Different materials show different spontaneous etching rates with respect to a particular etching gas, in particular, if they come from different material classes. Therefore, each material requires a specific adjustment of the ratio of the gas flow rates for the passivation gas and the etching gas. When etching metallic conducting layers whose metals may be impaired by the passivation gas, it may be beneficial to interrupt the supply of particular passivation gases.

Figure 2:
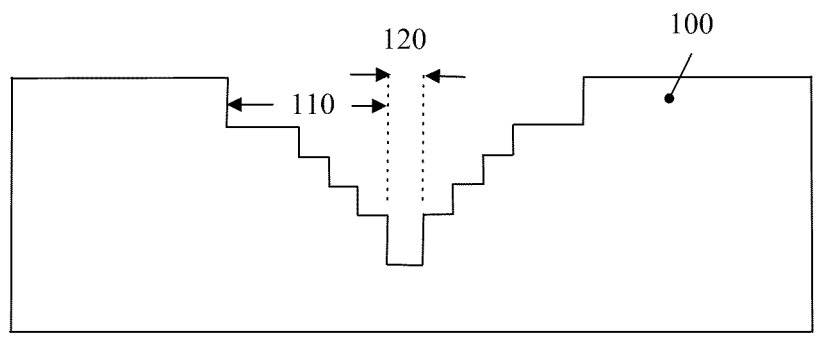
FIG. 2 shows a schematic enhanced cross section through a via etched in silicon according to a first aspect of the invention.

According to a first aspect, the method is at first described with the example of the etching of a silicon layer. FIG. 2 shows a via or an access hole etched in silicon with the inventive method. As it is already know from the above-referenced article of S. Matsui and K. Mori, the gas $XeF_2$ already etches silicon with rate of 7 nm/min without electron bombardment ("*Direct writing onto Si by electron beam stimulated etching*", Appl. Phys. Lett. 51(19), 1498 (1987)). This means that the ratio of the spontaneous etching rate to the etching rate induced by electron radiation is for silicon 1:1, i.e. silicon can spontaneously be removed alone by the etching gas $XeF_2$ and can therefore be removed isotropic with a large etching rate. Thus, silicon is a material which is well suited to demonstrate the benefits of the inventive method.

In the via represented in FIG. 2, silicon material 100 is removed in several layers, wherein successive layers have a smaller area. In this process, the electron beam parameter can be varied as described above. It may further be necessary to adjust the mixing ratio between the etching gas and the passivation gas depending on the size of the area to be processed and the material to be processed. For example, silicon can be etched with a mixing ratio of 1:1 between the etching gas and the passivation gas with a gas flow rate in the range of 0.25 sccm. At different materials, for example when etching the vias shown in FIGS. 4 and 6 different mixing ratios with less passivation gas may be favourable, as for example a ratio of 1:5 with gas flow rates of approximately 0.1 sccm for the passivation and approximately 0.5 sccm for the etching gas. The flat steep side walls of FIG. 2 show that the inventive method can efficiently suppress a spontaneous etching rate which is as large as the etching rate induced by the electron beam. For this reason, it is avoided that the etching gas $XeF_2$ spontaneously removes silicon at positions at which an electron beam is not present.

The passivation gas not only suppresses the spontaneous etching in lateral direction, but also suppresses at least partly the contribution of the spontaneous etching in the direction of the electron beam which is the vertical direction in FIG. 1. Thus, the etching rate in vertical direction can be reduced, in particular for gas flow rates of the passivation gas which are in the range of the gas flow rate of the etching gas. However, the application of the inventive method to silicon 100 still enables an etching rate which is sufficient for an economical application so that volumes of several $\mu m^3$ can be removed in silicon 100.

Figure 3:
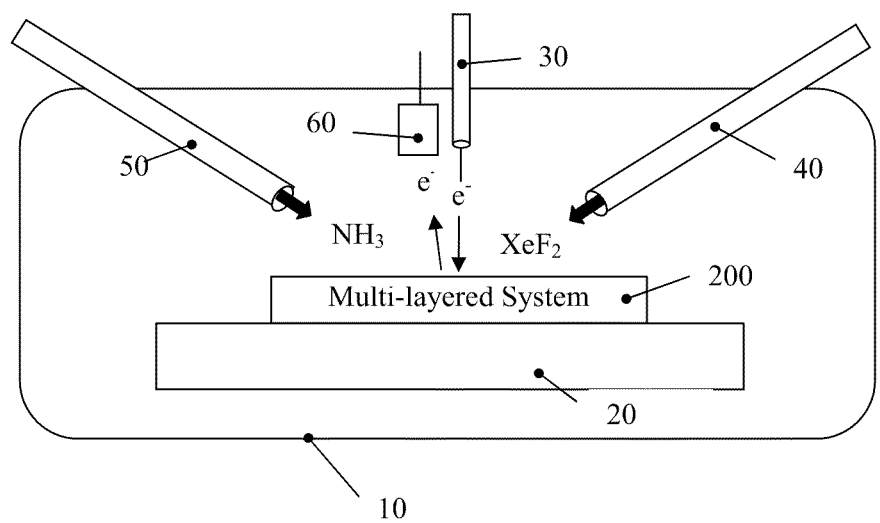
FIG. 3 shows a schematic representation for the realization of the method according to a second aspect of the invention, wherein a detector for electrons back-scattered from the electron beam or for secondary electrons released by the electron beam is additionally arranged in the vacuum chamber of FIG. 1 and the material to be etched comprises multiple layers (multi-layered system)

FIG. 3 shows a second aspect of an embodiment of the inventive method and of the inventive apparatus. FIG. 3 shows two essential modifications compared to FIG. 1. On the one hand, a material is arranged on the specimen holder 20 having multiple layers, the multi-layered system 200, and on the other hand a detector 60 is arranged in the vacuum chamber 10 for electrons which are back-scattered from the electron beam and for secondary electrons released from the electron beam. On the basis of the signal of the detector 60 changes in the material composition of the layer which is presently etched can be detected in comparison to the next layer. For this reason, by the evaluation of the signal of the detector 60, it can be determined that a first layer is removed in the multi-layered system 200 and the etching process starts with the removal of the second layer. In other words, the signal of the detector 60 enables to determine that the etching process has reached a layer boundary. As already mentioned during the discussion of FIG. 2, each material to be etched requires a specific ratio of the gas flow rates of the passivation gas and etching gas. When the provided gas flow rate of the passivation gas is too low in relation to the overall gas flow rate, spontaneous etching in this layer is not completely suppressed and a removal of the side walls is not completely prevented. On the other hand, if the ratio of the gas flow rates of the passivation gas to the etching gas is too high for the layer to be etched, the vertical etching rate may unnecessarily be reduced. In an extreme case, an etching process in a layer is no longer possible. The detection of the change in the material composition of the second layer 220 when reaching the layer boundary between the first 210 and the second layer 220, for example with the aid of the detector represented in FIG. 3, allows to adjust the ratio of the gas flow rates of the two gases $NH_3$ and $XeF_2$ for the second layer 220 which is now to be etched. Thus, the specific requirement is realized for the inhibition of the spontaneous etching rate in the second layer 220. Whether further layer boundaries are reached can also be taken from the signals of the detector 60. Thus, for an arbitrary multi-layered system 200, the ratio of the gas flow rates of the passivation gas and the etching gas can be optimized for each individual layer 210 to 280.

Figure 4:
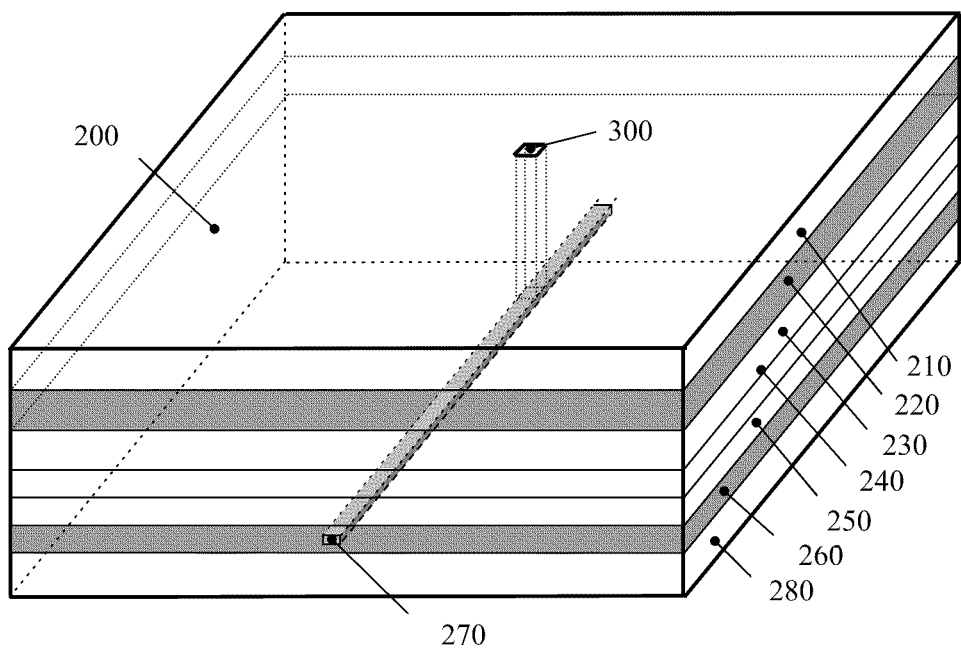
FIG. 4 shows a schematic enhanced representation of an etched material with multiple layers according to a second aspect of the invention.

FIG. 4 shows schematically how a via 300 can be etched to a metallic conducting connection 270 in a multi-layered system 200 through multiple layers 210 to 260, wherein the ratio of the gas flow rates of $NH_3$ and $XeF_2$ is adjusted at the layer boundaries of the layer newly to be etched. The supreme layer 210 is a dielectric layer which is similar to most of the isolator materials not spontaneously etched by $XeF_2$. Therefore, the layer 210 is removed without supply of $NH_3$. The layers 220, 230, 240 and 250 are semiconductor layers of various compositions and thicknesses. When the etching process has removed layer 210, i.e. the etching front reaches the layer boundary between the layers 210 and 220, this is directly determined in the signal of the detector 60. The material composition of the layer 220 can also be determined from the signal of the detector 60. The dosing valve for the supply of $NH_3$ is now opened to such an extent that the resulting gas flow rate of $NH_3$ suppresses spontaneous etching of the layer 220. As already mentioned above, a mixing ratio of approximately 1:5 may be favourable at gas flow rates in the range of 0.1 sccm for the passivation gas and of 0.5 sccm for the etching gas for the realisation of the inventive method.

In the example of FIG. 4, the subsequent system of semiconducting layers 230, 240 and 250 is etched with the same gas flow rate ratio of $NH_3$ to $XeF_2$ as for the layer 220. However, as explained in the preceding pages, the method allows individually adjusting the gas flow rate of $NH_3$ for each of the layers 230, 240 and 250.

The barrier layer 260 around the metallic conducting layer 260 consists similar to the layer 210 of a material which is not spontaneously etched by $XeF_2$. Therefore, after it has been detected on the basis of the signals of the detector 60 that the etching front has reached the boundary between the layers 250 and 260, the dosing valve for the supply of $NH_3$ is closed. Because the copper surface of the metallic conducting layer 280 might be damaged when it gets into contact with $NH_3$, the passivation gas is pumped down from the vacuum chamber 10. The removal of the layer 260 is carried out by the etching gas under the impact of the electron beam analogue to the etching of the dielectric layer 210. The disconnection of the metallic conducting connection 270 is also carried out under the combined impact of the etching gas and the electron beam. The multi-layered system 200 with the layer sequence 210 to 270 is arranged on a semi-conducting substrate 280.

The smallest area which can be etched is determined by the diameter of the electron beam. The beam diameter of the electron flow can be adjusted, in particular the electron beam can be focused very precisely (diameter <4 nm). Thus, the area to be etched which is the area illuminated by the electron beam can be chosen to be very small. Thus, the inventive method for suppressing of spontaneous etching opens-up the possibility to prepare very fine structures with a high aspect ratio and flat side walls.

Figure 5:
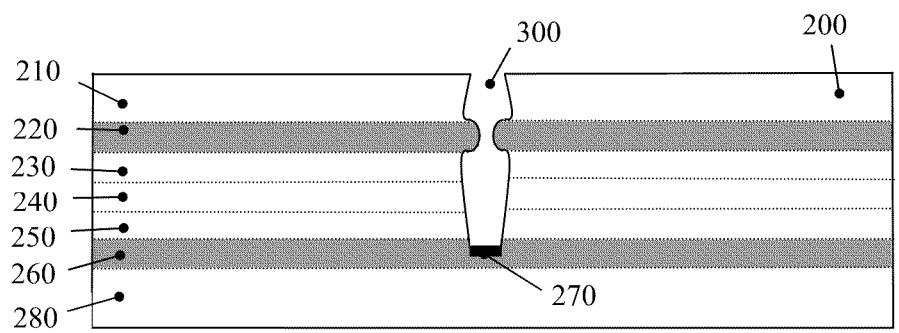
FIG. 5 shows a schematic cross section through the via of FIG. 4 when the etching has been performed with a method of the prior art.
Figure 6:
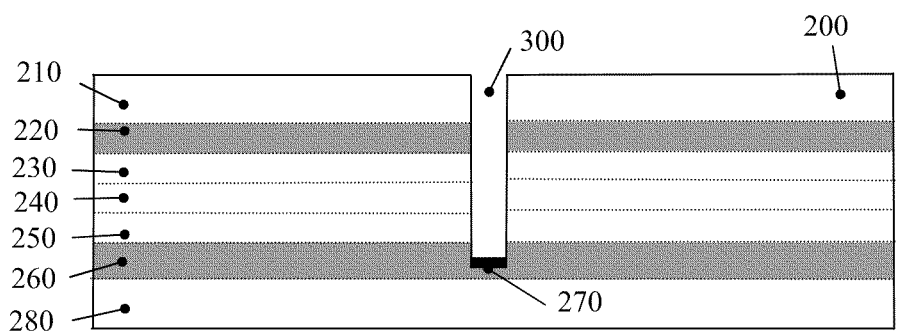
FIG. 6 shows a schematic cross section through the via of FIG. 4 when the etching has been performed with an inventive method.

FIGS. 5 and 6 clarify again an essential benefit of the inventive method. FIG. 5 shows an enhanced cut-out of a via 300 etched through a layer sequence with a method of the prior art. Due to the different etching rates in the semiconductor layers 210, 230, 240 and 250 on the one hand and of the isolation layers 220 and 260 on the other hand, a bottleneck occurs in the layer 220 and an expansion in the overlying layer 210 and the subjacent layer 230. In FIG. 6, the inventive method has been applied for the etching of the via 300 through the layer sequence 210 to 260 of FIG. 4. The essentially flat and vertical side walls of the via 300 facilitate the further process steps after the etching process.

The invention claimed is:

1. A method comprising:
    selecting a material to be etched using an electron beam and an etching gas;
    selecting a passivation gas from the group consisting of ammonia ($NH_3$), nitrogen ($N_2$), carbon tetrachloride ($CCl_4$) and methane ($CH_4$);
    selecting a ratio of a partial pressure of the etching gas to a partial pressure of the passivation gas so that the passivation gas inhibits spontaneous etching of the material by the etching gas; and
    simultaneously providing the etching gas and the passivation gas at a position of the material where the electron beam is absent so that the passivation gas inhibits spontaneous etching of the material by the etching gas at the position.

2. The method of claim 1, wherein the etching gas comprises xenon difluoride.

3. The method of claim 1, wherein the passivation gas comprises ammonia.

4. The method of claim 1, comprising continuously providing the passivation gas, or intermittently providing the passivation gas.

5. The method of claim 1, wherein the material comprises silicon.

6. The method of claim 1, wherein the ratio of the partial pressure of the etching gas to the partial pressure of the passivation gas is greater than or equal to one at the position of the material.

7. The method of claim 1, comprising providing the passivation gas at a rate of 0.25 standard cubic centimeters per minute.

8. The method of claim 1, wherein the material comprises multiple layers, and the method further comprises:
    using the electron beam to etch a region of the material exposed to the etching gas and the electron beam;
    determining whether a layer boundary between first and second layers is reached as a result of etching the material; and
    adapting the provision of the passivation gas to slow down etching in the second layer or to inhibit lateral etching of the second layer.

9. The method of claim 8, comprising evaluating an analysis signal to determine whether the layer boundary is reached.

10. The method of claim 9, comprising detecting backscattered electrons and/or secondary electrons to obtain the analysis signal.

11. The method of claim 8, comprising measuring etching time to determine whether the layer boundary is reached.

12. The method of claim 8, comprising adjusting the partial pressure of the etching gas at the layer boundary.

13. The method of claim 8, wherein the method etches a clearance hole to buried electric conducting connections.

14. The method of claim 8, wherein the multiple layers comprise a dielectric layer, a semiconductor layer, and an electric conducting layer.

15. The method of claim 9, comprising providing the passivation gas at a rate of 0.1 standard cubic centimeters per minute, and etching of the semiconductor layer.

16. The method of claim 8, further comprising:
    interrupting the provision of the passivation gas before reaching a copper containing layer; and
    removing the passivation material from a vacuum chamber housing the material.

17. The method of claim 1, wherein the method produces a semiconductor device having an etched structure.

18. The method of claim 8, wherein the passivation gas comprises ammonia ($NH_3$).

19. The method of claim 18, comprising evaluating an analysis signal to determine whether the layer boundary is reached.

20. The method of claim 19, comprising detecting backscattered electrons and/or secondary electrons to obtain the analysis signal.

21. The method of claim 18, comprising measuring etching time to determine whether the layer boundary is reached.

22. The method of claim 18, comprising adjusting a partial pressure of the etching gas at the layer boundary.

23. The method of claim 18, wherein the method etches a clearance hole to buried electric conducting connections.

24. The method of claim 18, wherein the multiple layers comprise a dielectric layer, a semiconductor layer, and an electric conducting layer.

25. The method of claim 18, further comprising:
   interrupting the provision of the passivation gas before reaching a copper containing layer; and
   removing the passivation material from a vacuum chamber housing the material.

26. The method of claim 1, further comprising using an electron beam to etch a region of the material exposed to the etching gas and the electron beam.

\* \* \* \* \*

UNITED STATES PATENT AND TRADEMARK OFFICE
CERTIFICATE OF CORRECTION

PATENT NO. : 9,023,666 B2  
APPLICATION NO. : 13/058587  
DATED : May 5, 2015  
INVENTOR(S) : Nicole Auth et al.

Page 1 of 1

It is certified that error appears in the above-identified patent and that said Letters Patent is hereby corrected as shown below:

ON THE TITLE PAGE

Page 1, Col. 2, line 2, under "OTHER PUBLICATIONS" delete "Left." and insert -- Lett. --.

Page 2, Col. 2, line 18, under "OTHER PUBLICATIONS" delete "Left." and insert -- Lett. --.

Page 2, Col. 2, line 27, under "OTHER PUBLICATIONS" delete "Aigaas" and insert -- Algaas --.

IN THE SPECIFICATION

Col. 1, line 11, delete "roll" and insert -- role --.

Col. 5, line 2, delete "roll" and insert -- role --.

IN THE CLAIMS

Col. 8, line 60, Claim 15, delete "claim 9," and insert -- claim 14, --.

Signed and Sealed this  
Third Day of November, 2015

Michelle K. Lee  
*Director of the United States Patent and Trademark Office*